(12) United States Patent
Hedrick et al.

(10) Patent No.: US 7,695,776 B2
(45) Date of Patent: Apr. 13, 2010

(54) TRANSPARENT HARD COATS FOR OPTICAL ELEMENTS

(75) Inventors: Jeffrey Curtis Hedrick, Park Ridge, NJ (US); David Andrew Lewis, Carmel, NY (US); Stanley Joseph Whitehair, Peekskill, NY (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 12/154,568

(22) Filed: May 23, 2008

(65) Prior Publication Data
US 2008/0286493 A1 Nov. 20, 2008

Related U.S. Application Data

(63) Continuation of application No. 09/129,737, filed on Aug. 5, 1998, now Pat. No. 7,378,146.

(51) Int. Cl.
*H05H 1/24* (2006.01)

(52) U.S. Cl. .................... 427/579; 427/578; 427/569

(58) Field of Classification Search ................ None
See application file for complete search history.

(56) References Cited

U.S. PATENT DOCUMENTS

| | | | | |
|---|---|---|---|---|
| 4,842,941 A | * | 6/1989 | Devins et al. | 428/412 |
| 5,928,732 A | * | 7/1999 | Law et al. | 427/579 |
| 5,968,324 A | * | 10/1999 | Cheung et al. | 204/192.28 |

* cited by examiner

*Primary Examiner*—Timothy Meeks
*Assistant Examiner*—Kelly M Gambetta
(74) *Attorney, Agent, or Firm*—Thomas A. Beck; Daniel P. Morris

(57) ABSTRACT

The present invention related to an improved structure of an optically transparent element that can be used in optical scanners, supermarket scanners, lenses for eyeglasses, etc. The application of oxynitride PECVD films provide good hardness and optical transparency. Such films displaying these physical properties are extremely useful as a scratch resistant coatings in lenses and systems in which an article contacts a transparent surface, such as in scanners and in environments in which intermittent, environmental contact occurs such as in displays for computers and suchlike and in liquid crystal displays, touch displays and compact disks.

5 Claims, 1 Drawing Sheet

US 7,695,776 B2

TRANSPARENT HARD COATS FOR OPTICAL ELEMENTS

This application is a continuation of Ser. No. 09/129,737, filed Aug. 5, 1998, now U.S. Pat. No. 7,378,146 issued May 27, 2008.

TECHNICAL FIELD

The present invention related to an improved structure of an optically transparent element that can be used in optical scanners, supermarket scanners, lenses for eyeglasses, etc. The application of oxynitride PECVD films provide good hardness and optical transparency. Such films displaying these physical properties are extremely useful as a scratch resistant coatings in lenses and systems in which an article contacts a transparent surface, such as in scanners and in environments in which intermittent, environmental contact occurs such as in displays for computers and suchlike and in liquid crystal displays, touch displays and compact disks.

BACKGROUND

This invention relates to a coating system which forms a highly abrasion resistant, chemical resistant, impact resistant protective finish for a substrate.

This invention relates to items such as face shields which are exposed to solvents and high velocity particulates such as found in sand blasting operations, etc. These devices are manufactured from impact resistant polycarbonate which is relatively soft and susceptible to scratching and damage with severely limits the life of these articles. Polycarbonate is also susceptible to solvents such as acetone, methylethylketone, methylene chloride, etc. Most coatings which can be applied and impart these desirable properties are not transparent to light and result in distortion, attenuation of light or color dispersion which are undesirable. It would be desirable to have a coating on the face shield which provides the properties described above and is also transparent to optical radiation.

Coating compositions have been developed which, when applied to a substrate impart a highly abrasion resistant surface to the substrate. Coating compositions of this type have been widely used to impart abrasion resistance to plastic lenses such as eyeglass lenses, to plastic panels and films, to wood surfaces such as furniture, and many other applications where an abrasion resistant or scratch resistant surface finish is of importance.

Abrasion resistant coatings of this type are typically organic based materials which are cured or crosslinked after application of the coating, typically by radiation curing. Radiation curable coatings offer the advantage of being rapidly cured and polymerized without requiring curing ovens and they can be applied and processed without having to remove solvents and deal with solvent vapors in the workplace environment.

Prior abrasion resistant coatings have sought to deal with the brittleness and cracking problem by using a softening comonomer (a monomer with a low second order transition temperature) to impart some degree of flexibility to the coating. However, in achieving increased flexibility and reduced brittleness, the abrasion resistance of the coating is sacrificed.

To overcome the disadvantage of a brittle coating, a PECVD process can deposit an inorganic film which has a considerably higher modulus, hardness and scratch resistance such as U.S. Pat. No. 5,470,661 incorporated herein by reference in its entirety. Recently, a method has been disclosed for the deposition of a silicon oxynitride film. This film has excellent hardness, high modulus and it was discovered that this coating can be transparent to optical radiation and therefore useful in applications in which transparent hardcoats are used.

The resistance of a coating to scratching abrasion is typically measured by the rotary steel wool test, which involves subjecting the coating to five revolutions of a pad of 0000 grade steel wool at a defined pressure, usually 12 or 24 psi. The scratching abrasion resistance is rated by measuring the increase in haze from the abrasion. Test methods such as ASTM D-1044 have been developed for optically measuring the resistance of transparent plastic materials to abrasion. Other standard tests for abrasion resistance are the Taber abrasion test described in ASTM D-1004-56.

In many applications, the protective finish needs not only to be "hard" and thus resistant to scratching, but also must have excellent toughness and resistance to impact. The toughness or impact abrasion resistance of a coating is commonly measured by the "falling sand" test (ASTM D968-51). A coating which has good scratch abrasion resistance may not necessarily have good impact abrasion resistance. With the falling sand test, sand is poured onto a coating from a predetermined height, while the thickness of the coating is observed. The results are expressed in terms of the number of liters of sand required to abrade away one tenth of a mil of the coating thickness. The radiation cured abrasion resistance coatings noted in the aforementioned prior patents have a relatively poor resistance to impact abrasion which renders these types of coatings unacceptable for applications requiring both good resistance to scratching abrasion an good resistance to impact abrasion.

With the foregoing in mind, it is an important object of the present invention to provide a coating system which provides not only good resistance to scratching abrasion, but also provides excellent resistance to impact abrasion.

SUMMARY

The present invention relates to an improved method of manufacturing optically transparent elements such as computer displays, including CRT and liquid crystal based systems, scanners and lenses for eyeglasses.

It is a further aspect of this invention to provide an external coating on optically transparent devices to provide high scratch resistance, thereby increasing their usefulness and lifetime.

It is a further aspect of this invention to use plasma-enhanced chemical vapor deposition (PECVD) of materials such as silicon oxynitride to provide high scratch resistance to an optical element.

These and other objects, features and advantages will be apparent from the following more particular description of the preferred embodiments.

BRIEF DESCRIPTION OF THE DRAWINGS

FIG. 1 shows an optically transparent coating on an optically transparent substrate that permits light to pass through.

FIG. 2 shows an optically transparent coating on an optically transparent substrate with an irregular surface that permits light to pass through.

DESCRIPTION OF THE PREFERRED EMBODIMENT

Figure 1:
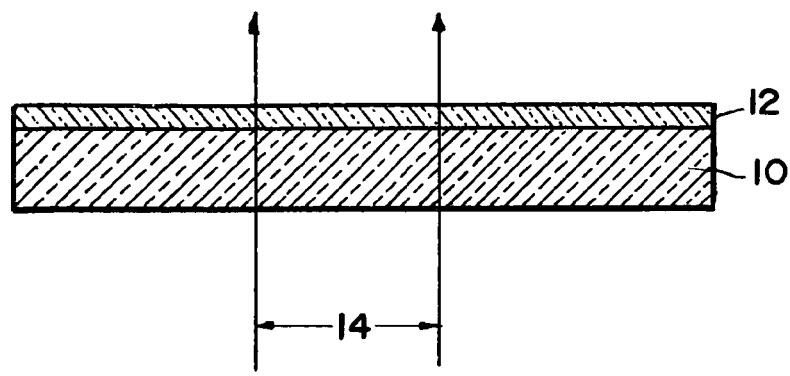

To achieve even low to moderate deposition rates (less than 1000 Angstroms/min.), plasma-enhanced processes conventionally must use ammonia to deposit silicon nitride or silicon oxynitride. A typical PECVD gas flow chemistry for depositing silicon nitride comprises silane and ammonia reactants along with a diluent, e.g., nitrogen, argon or helium as follows:

$$SiH_4 + NH_3 + N_2(diluent) \rightarrow Si_xN_yH_z. \quad (1)$$

Undesirably, as a consequence of using ammonia to obtain acceptable deposition rates and throughput, the concentration of hydrogen in the deposited silicon nitride can be quite high, as much as 25-30 atom percent. The presence of hydrogen in structures formed relatively early in the IC fabrication process and the hydrogen diffusion which results during subsequent high temperature fabrication steps can cause non-uniform electrical characteristics. Even for final passivation films, however, the presence of such high concentrations of hydrogen can create problems.

The nitrogen-based gas chemistry uses the reactants $SiH_4$ and nitrogen at low frequency RF power (for example, 50 kHz) to provide compressively stressed, relatively dense films, but deposition rates of only about 200-400 Angstroms per minute or less. As was alluded to previously, this low deposition rate capability (and the resulting low throughput) is the crucial limitation of this prior art nitride-based gas chemistry process, and is the reason for its limited use. To increase the deposition rate, power must be increased, which causes potentially very high compressive stress, possibly leading to wrinkling, and other structural degradation.

To our knowledge, the only prior use of nitrogen-based gas chemistry without ammonia to deposit good quality, compressively stressed silicon nitride films at relatively high deposition rates is described in commonly assigned U.S. Pat. No. 4,668,365, entitled "APPARATUS AND METHOD FOR MAGNETRON-ENHANCED PLASMA-ASSISTED CHEMICAL VAPOR DEPOSITION", issued May 26, 1987 (referred to here as the "referenced magnetic field-enhanced PECVD reactor/patent"), which patent is incorporated by reference herein in its entirety. The referenced magnetic field-assisted PECVD patent describes a cylindrical reactor in which the substrate(s) is oriented parallel to the cylinder axis; RF power typically of 400 to 1,000 watts is applied to form DC bias of 50 to 250 volts perpendicular to the substrate; a pair of circular electromagnets form a magnetic field typically of 25 to 100 gauss parallel to the substrate; and SiH4 and N2 gaseous reactants are communicated into the chamber at typical total flows of 100-800 sccm using a substrate temperature of 20°-200° C. and a chamber pressure of less than 100 millitorr to deposit slightly compressively stressed silicon nitride at a deposition rate of 1,000 to 5,000 Angstroms per minute. The deposited silicon nitride film is compressively stressed, and has a hydrogen content of 5-13 weight percent and a refractive index Nf of about 1.7-2.

We have found that the addition of $N_2O$ to our basic $N_2/SiH_4$ nitrogen-based gas chemistry provides silicon oxynitride films which are characterized by low hydrogen content, very well controlled within wafer composition uniformity of four to five percent, as well as high deposition rates and controlled stress. Relative to the silicon nitride deposition discussed above, the $N_2O$ additive has the effect of decreasing the refractive index, increasing the deposition rate and decreasing compressive stress. Table 1 lists an exemplary set of parameters/results for depositing silicon oxynitride, again on silicon substrates and evidences these effects.

TABLE 1

SILICON OXYNITRIDE DEPOSITION

| PARAMETERS/RESULT | VALUE |
|---|---|
| Power, watts | 350; 1.5 W/cm$^2$ |
| Pressure, Torr. | 5.0 |
| Wafer Temperature ° C. | 300-360 |
| Gas Chemistry: SiH$_4$/N$_2$/N$_2$O sccm | 85/4.5 slm/30 |
| Electrode spacing, d (mils) | 300 |
| Dep. Rate Å/minute | 4000 |
| Refractive Index | 1.75 |
| H content, atomic % | <6 |
| Stress, dynes/cm$^2$ | −5 E8, compressive |
| Within wafer uniformity, % | +/−5 |

Also, in general the discussion above regarding silicon nitride deposition and the effect of various factors in controlling stress, bonding and other properties applies here as well.

For example, Table 2 indicates the effect of adding ammonia as a dopant. Consistent with the previous discussion of silicon nitride films, the ammonia increases the hydrogen content and the deposition rate.

TABLE 2

SILICON OXYNITRIDE DEPOSITION

| PARAMETERS/RESULT | VALUE |
|---|---|
| Power, watts | 350; 1.5 W/cm$^2$ |
| Pressure, Torr. | 5.0 |
| Wafer Temperature ° C. | 300-360 |
| Gas Chemistry: SiH$_4$/N$_2$/NH$_3$/N$_2$O sccm | 80/4.5 slm/50/40 |
| Electrode spacing, d (mils) | 300 |
| Dep. Rate Å/minute | 5000 |
| Refractive Index | 1.75 |
| H content, atomic % | <10 |
| Stress, dynes/cm$^2$ | −5 E8, compressive |
| Within wafer uniformity, % | +/−5 |

Figure 2:
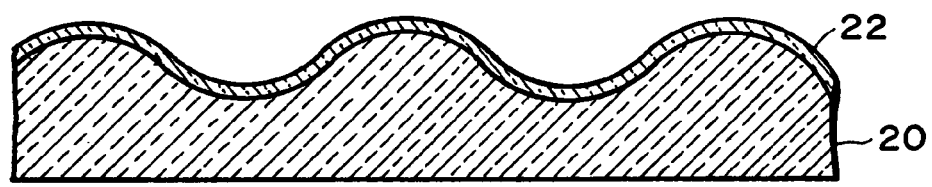

This coating can be applied to a variety of transparent substrates with the result that the substrates take on a scratch resistant behavior. This can be seen in FIG. 1 which schematically shows an optically transparent substrate 10 with a coating 12, preferably made of silicon oxynitride deposited by the techniques described herein above. Both the substrate and the scratch resistant coating allow light 14 to pass through substantially without interference or attenuation. Because of the deposition technique, the coating 22 can also be applied to an irregular surface 20 as shown in FIG. 2. It should be noted that depending on the irregularity of the substrate surface, there may be some scattering of light due to the surface topography, which my be advantageous or disadvantageous depending on the application being considered.

Figure 3:
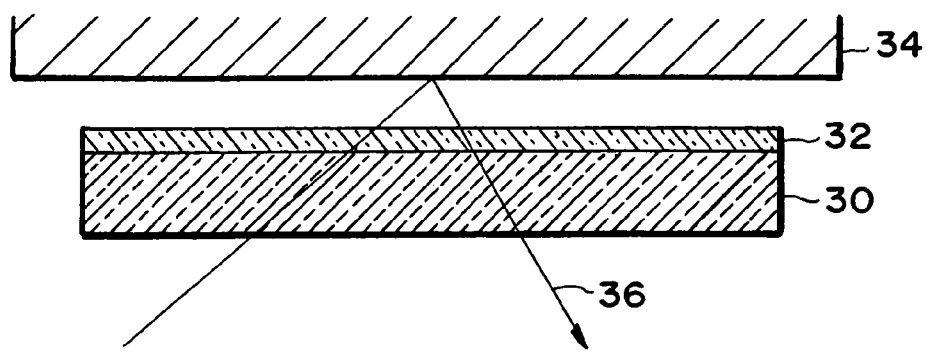
FIG. 3 shows an optically transparent substrate with a scratch resistant coating showing a light beam passing through the optically transparent substrate and coating and reflecting from another substrate and passing back through the optically transparent coating and substrate in an application such as a scanner.

Furthermore, light can pass through the substrate twice, This is shown in FIG. 3 and is an example from a photocopier, scanner, supermarket scanner, etc. In this example, a light beam 36 can pass through the transparent substrate 30 and the coating 32, strike another substrate 34, which can be paper with a pattern (such as text, picture, etc.) and pass back through the coating 32 and substrate 30 to a detector which can then process the reflected light.

Ideally, the thickness of the coating is optimized such that it is minimal but in the range 10 to 5000 nm, preferably 50 to 1000 nm. The optimization is such that is sufficiently thick to provide sustained abrasion resistance, but not so thick that stresses generated by thermal mismatch and the deposition provide excessive residual stress.

While the present invention has been described with respect to preferred embodiments, numerous modifications, changes, and improvements will occur to those skilled in the art without departing from the spirit and scope of the invention.

What we claim and desire to protect by Letters Patent is:

1. A process for depositing a continuous, abrasion, chemical and impact resistant silicon oxynitride coating on a substrate comprising:

admixing silane ($SiH_4$), one inert diluent gas selected from the group consisting of nitrogen gas ($N_2$), helium (He) and argon (Ar) and nitrous oxide ($N_2O$) to provide a gas mixture;

providing a plasma chamber suitable for plasma-enhanced chemical vapor deposition which contains a substrate and a substrate support electrode;

introducing said gas mixture into said plasma chamber at a plasma source at flow rates of 85 slm/4.5 slm/30 sccm ($SiH_4$/Diluent Gas/$N_2O$) and applying RF power of 350 watts, equivalent to approximately 1.5 $W/cm^2$, and a pressure therein of about 5 Torr, to generate a plasma from said gas mixture, said substrate being subjected to an electrode spacing of 300 mils from said plasma source, having a temperature between 300° and 360° C. and a deposition rate per minute of between about 4000 Å and 5000 Å during said process;

wherein an optically transparent silicon oxynitride film of between about 10 and 5000 nm is formed on said substrate, said silicon oxynitride film having a refractive index of about 1.75, an atomic hydrogen content of less than 10% and a thickness uniformity on said substrate of about 5%.

2. The process defined in claim 1 wherein said substrate is silicon.

3. The process defined in claim 2 wherein said diluent gas is nitrogen ($N_2$).

4. The process defined in claim 3 wherein said film is between about 50 and 1000 nm.

5. The process defined in claim 1 wherein said substrate has an irregular surface.

* * * * *